United States Patent
Koinuma et al.

(10) Patent No.: US 7,442,252 B2
(45) Date of Patent: *Oct. 28, 2008

(54) METHOD FOR PRODUCING SINGLE CRYSTAL OF MULTI-ELEMENT OXIDE SINGLE CRYSTAL CONTAINING BISMUTH AS CONSTITUTING ELEMENT

(75) Inventors: Hideomi Koinuma, Tokyo (JP); Yuji Matsumoto, Kanagawa (JP); Ryota Takahashi, Tokyo (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 129 days.

This patent is subject to a terminal disclaimer.

(21) Appl. No.: 10/557,044

(22) PCT Filed: May 21, 2004

(86) PCT No.: PCT/JP2004/007309

§ 371 (c)(1),
(2), (4) Date: Nov. 16, 2005

(87) PCT Pub. No.: WO2004/104276

PCT Pub. Date: Dec. 2, 2004

(65) Prior Publication Data

US 2006/0288925 A1    Dec. 28, 2006

(30) Foreign Application Priority Data

May 21, 2003  (JP) .............................. 2003-144085
May 20, 2004  (JP) .............................. 2004-150881

(51) Int. Cl.
C30B 25/00  (2006.01)
C30B 28/12  (2006.01)
B32B 9/04   (2006.01)
B32B 9/06   (2006.01)

(52) U.S. Cl. ............................ 117/89; 117/87; 117/88; 117/92; 117/93; 117/94; 117/104; 428/448; 428/450; 428/697

(58) Field of Classification Search ............. 117/87–89, 117/92, 93, 94, 104; 428/448, 697, 450
See application file for complete search history.

(56) References Cited

U.S. PATENT DOCUMENTS

| | | | |
|---|---|---|---|
| 6,888,156 B2 * | 5/2005 | Chikyow et al. | 257/12 |
| 2004/0029737 A1 * | 2/2004 | Koinuma et al. | 505/100 |
| 2005/0179034 A1 * | 8/2005 | Chikyow et al. | 257/43 |
| 2005/0233163 A1 * | 10/2005 | Koinuma et al. | 428/660 |

FOREIGN PATENT DOCUMENTS

JP          61-6124         1/1986

(Continued)

OTHER PUBLICATIONS

Munoz et al, Crystal and Magnetic Structures of Bi2CuO4, J. Phys.-Condensed Matter, 1990, IOP Publishing Ltd, pp. 2205-2214.*

(Continued)

*Primary Examiner*—Robert M. Kunemund
*Assistant Examiner*—G. Nagesh Rao
(74) *Attorney, Agent, or Firm*—Westerman, Hattori, Daniels & Adrian, LLP.

(57) ABSTRACT

The present invention provides methods for producing a multi-element oxide single crystal which contains Bi, which has high crystallinity independently of a preparation process, and which is represented by the formula $(Bi_2O_2)A_{m-1}B_mO_{3m+1}$, wherein A is Sr, Ba, Ca, or Bi and B is Ti, Ta, or Nb.

A flux layer, containing a composition satisfying the inequality $0 < CuO/Bi_2O_3 < 2$ and/or $0 \leq TiO/Bi_2O_3 < 7/6$ on a molar basis is deposited on a wafer and a single-crystalline thin-film is then deposited on the flux layer placed on the wafer. A melt of a composition which contains raw materials and a flux and which satisfies the above inequality is prepared and the melt is cooled such that a single crystal is grown. A CuO flux layer is deposited on a wafer and Bi—Ti—O is supplied to the flux layer using a $Bi_6Ti_3O_{12}$, $Bi_7Ti_3O_{12}$, or $Bi_8Ti_3O_{12}$ target of which the Bi content is greater than that of an object film such that a $Bi_4Ti_3O_{12}$ single-crystalline thin-film is formed above the wafer.

5 Claims, 5 Drawing Sheets

FOREIGN PATENT DOCUMENTS

| | | | |
|---|---|---|---|
| JP | 63-171869 | | 7/1988 |
| JP | 63-171870 | | 7/1988 |
| JP | 01219023 A | * | 9/1989 |
| JP | 1-275493 | | 11/1989 |
| JP | 03218964 A | * | 9/1991 |
| JP | 5-246722 | | 9/1993 |
| JP | 9-67197 | | 3/1997 |
| JP | 10-158094 | | 6/1998 |
| JP | 10-273396 | | 10/1998 |
| JP | 10-338599 | | 12/1998 |
| JP | 2002-68893 | | 3/2002 |

OTHER PUBLICATIONS

Hazen et al, Superconductivity in the High-Tc Bi-Ca-Sr-Cu-O System: Phase Identification, 1988, Physical Review Letters, vol. 60 No. 12, pp. 1174-1177.*

English Abstract for JP01219023A.*

English Abstract for JP0321896A.*

Yoichiro Masuda et al.; "Crystal Growth, Dielectric and Polarization Reversal Properties of $Bi_4Ti_3O_{12}$ Single Crystal"; Japan J. Appl. Phys. vol. 31, Part 1, No. 9B, Sep. 1992, pp. 3108-3112. Cited in spec.

Rintaro Aoyagi et al.; "Crystal Growth and Characterization of Lanthanum Substituted Bismuth Titanate Single Crystal", Japan J. Appl. Phys. vol. 40, Part 1, No. 9B, Sep. 2001, pp. 5671-5674. Cited in spec.

K. S. Yun et al.; Vapor-liquid-solid tri-phase pulsed-laser epitaxy of $RBa_2Cu_3O_{7-y}$ single-crystal films, Applied Physics Letters, vol. 80, No. 1, Jan. 7, 2002, pp. 61-63. Cited in spec.

29p-F-17, Fabrication and Characterization of $Bi_4Ti_3O_{12}$ Thin Film by Tri-phase-epitaxy.

* cited by examiner

14 Raw Material - Flux Mixture
11 Platinum Crucible
12 Alumina Crucible
13 Alumina Powder (Left Image)
Thin-Film Prepared by Known Process (Right Image)
Thin-Film Prepared Using Bi-Ti-Cu Flux Bi₂O₃ : TiO₂ = 11 : 3    Bi₂O₃:TiO₂:CuO = 10 : 3 : 1
(mol ratio)

AFM Images for Comparison (Thin-Film Prepared Using No Flux (Left Image) and Thin-Film Prepared Using CuO Flux (Right Image))

TEM Images for Comparison (Thin-Film Prepared Using No Flux (Upper Image) and Thin-Film Prepared Using CuO Flux (Lower Image))

METHOD FOR PRODUCING SINGLE CRYSTAL OF MULTI-ELEMENT OXIDE SINGLE CRYSTAL CONTAINING BISMUTH AS CONSTITUTING ELEMENT

TECHNICAL FIELD

The present invention relates to methods for producing a thin film-shaped or bulk multi-element oxide single crystal which contains bismuth which has high crystallinity.

BACKGROUND ART

A sputtering process, an MBE process, a pulsed laser deposition process, an MOCVD process, or another process is used to produce a thin-film of single-crystalline multi-element oxide, such as $Bi_4Ti_3O_{12}$, containing bismuth as well known (see, for example, Patent Documents 1 to 6). Furthermore, the following process is used to produce a single crystal as well known: a flux process for growing a single crystal in a solution using a flux that is a compound which does not react with a target substance and raw materials and which can be readily separated therefrom (see Patent Document 7). A $Bi_2O_3$ flux is used to produce a bulk single crystal of $Bi_4Ti_3O_{12}$ by such a flux process (see Non-patent Documents 1 and 2).

Fluxes are additives used to produce single crystals. The fluxes promote the growth of crystals and enable the synthesis of a thermodynamically unstable substance by reducing the synthesis temperature. Flux epitaxy is a process for fabricating a thin-film using a flux (see Non-patent Documents 3 and 4). It has been recently found that a high-quality bulk single-crystalline thin-film can be fabricated by the flux epitaxy.

The inventors have filed a patent application claiming invention for a method for producing a single-crystalline oxide thin-film by a three-phase epitaxial process (see Patent Document 8). In this method, a flux layer is formed by depositing a flux material on a wafer in advance such that a flux layer is formed on the wafer and a high-quality thin-film is deposited on the flux layer, the flux material being Ba—Cu—O. The flux material is known in the field of bulk single crystal production and provides an element of an $NdBa_2Cu_3O_7$ single crystal.

Patent Document 1: Japanese Unexamined Patent Application Publication No. 61-6124
Patent Document 2: Japanese Unexamined Patent Application Publication No. 63-171869 (Japanese Patent No. 2547203)
Patent Document 3: Japanese Unexamined Patent Application Publication No. 63-171870 (Japanese Patent No. 2547204)
Patent Document 4: Japanese Unexamined Patent Application Publication No. 05-246722 (Japanese Patent No. 3195827)
Patent Document 5: Japanese Unexamined Patent Application Publication No. 09-67197
Patent Document 6: Japanese Unexamined Patent Application Publication No. 10-158094 (Japanese Patent No. 2939530)
Patent Document 7: Japanese Unexamined Patent Application Publication No. 10-338599
Patent Document 8: Japanese Unexamined Patent Application Publication No. 2002-68893

Non-patent Document 1: Yoichiro Matsuda, Hiroshi Matsumoto, Akira Baba, Takashi Goto, and Toshio Hirai, Jpn. J. Appl. Phys., Vol. 31, (1992) 3108
Non-patent Document 2: Rintaro Aoyagi, Hiroaki Takeda, Soichiro Okamura, Tadashi Shiosaki, Jpn. J. Appl. Phys., Vol. 40, (2001) 5671
Non-patent Document 3: K. S. Yun, B. D. Choi, Y. Matsumoto, J. H. Song, N. Kanda, T. Itoh, M. kawasaki, T. Chikyowl and P. Ahmet, H. Koinuma, Appl. Phys. Lett. 80, 61-63 (2002)
Non-patent Document 4: Ryuta Takahashi et. al., "Dai 50 Kai Ouyoubutsurigaku Kankeirengou Kouenkai Kouenyokoushu", p. 658, (March 2003)

DISCLOSURE OF INVENTION

[Problems to be Solved by the Invention]

If a thin-film is deposited on a wafer by the sputtering process, the MBE process, the pulse laser deposition process, or the MOCVD process, the thin-film is apt to lack Bi having a high vapor pressure. If a thin-film is prepared in the presence of an excessive amount of Bi as disclosed in Patent Document 6, this thin-film contains an excessive amount of Bi and therefore has low crystallinity. A ferroelectric oxide, which is a bismuth layered ferroelectric material such as $Bi_4Ti_3O_{12}$, $Bi_4BaTi_4O_{15}$, $Bi_4SrTi_4O_{15}$, $Bi_4CaTi_4O_{15}$, $SrBi_2Ta_2O_9$, or $SrBi_2Nb_2O_9$, is represented by the formula $(Bi_2O_2)A_{m-1}B_mO_{3m+1}$, wherein A is Sr, Ba, Ca, or Bi and B is Ti, Ta, or Nb. A single crystal of the ferroelectric oxide is prepared using a $Bi_2O_3$ flux. Since the $Bi_2O_3$ flux is harmful to the environment, the amount of the $Bi_2O_3$ flux used must be reduced.

In order to solve the above problems involved in the known methods, it is an object of the present invention to provide methods for producing an oxide single crystal having high crystallinity independently of a preparation process. The method is useful in producing a single crystal of a multi-element oxide, such as $Bi_4Ti_3O_{12}$, $Bi_4BaTi_4O_{15}$, $Bi_4SrTi_4O_{15}$, $Bi_4CaTi_4O_{15}$, $SrBi_2Ta_2O_9$, or $SrBi_2Nb_2O_9$, containing Bi.

[Means for Solving the Problems]

The present invention provides methods for producing a thin film-shaped or bulk single crystal containing Bi. In order to form such a thin film-shaped single crystal above a wafer, a flux layer is deposited on the wafer in advance and the single crystal is deposited on the flux layer placed on the wafer. Alternatively, in order to produce such a bulk single crystal, a flux and raw materials for producing the oxide single crystal are melted, a crystal nucleus is created by gradually cooling the melt, and the crystal nucleus is grown into the oxide single crystal, that is, the oxide single crystal is produced by a flux process so as to have high crystallinity.

(1) A method for producing a multi-element oxide single crystal containing bismuth according to present invention includes a step of depositing a flux layer, containing a two-element composition satisfying the inequality $0<CuO/Bi_2O_3<2$ or a three-element composition satisfying the inequalities $0<CuO/Bi_2O_3<2$ and $0\leq TiO/Bi_2O_3<7/6$ on a molar basis, on a wafer and a step of depositing a single-crystalline thin-film on the flux layer placed on the wafer.

(2) A method for producing a multi-element oxide single crystal containing bismuth according to present invention includes a step of depositing a CuO flux layer on a wafer and a step of supplying Bi—Ti—O to the flux layer to form a $Bi_4Ti_3O_{12}$ single-crystalline thin-film above the wafer using a $Bi_6Ti_3O_{12}$, $Bi_7Ti_3O_{12}$, or $Bi_8Ti_3O_{12}$ target of which the Bi content is greater than that of an object film.

(3) In the method specified in Item (1) or (2), the deposition of the flux layer or the single-crystalline thin-film is performed by a sputtering process, an MBE process, a pulsed laser deposition process, or an MOCVD process.

(4) In the method specified in any one of Items (1) to (3), the wafer is a $SrTiO_3$ (001) wafer, an $Al_2O_3$ wafer, a Si wafer, a $LaAlO_3$ wafer, a MgO wafer, or a $NdGaO_3$ wafer.

(5) A method for producing a multi-element oxide single crystal containing bismuth according to present invention includes a step of preparing a melt of a $Bi_2O_3$—CuO two-element or $Bi_2O_3$—CuO—TiO three-element composition containing raw materials and a flux, the two-element composition satisfying the inequality $0<CuO/Bi_2O_3<2$, the three-element composition satisfying the inequalities $0<CuO/Bi_2O_3<2$ and $0 \leq TiO/Bi_2O_3<7/6$ on a molar basis, and a step of cooling the melt to grow a single crystal.

(6) In the method specified in any one of Items (1) to (5), the multi-element oxide single crystal is $Bi_4Ti_3O_{12}$, $Bi_4BaTi_4O_{15}$, $Bi_4SrTi_4O_{15}$, $Bi_4CaTi_4O_{15}$, $SrBi_2Ta_2O_9$, or $SrBi_2Nb_2O_9$.

Since the flux layer containing the two-element composition satisfying the inequality $0<CuO/Bi_2O_3<2$ or the three-element composition satisfying the inequalities $0<CuO/Bi_2O_3<2$ and $0 \leq TiO/Bi_2O_3<7/6$ on a molar basis is used and the single-crystalline thin-film is deposited on the flux layer placed on the wafer, the thin-film has higher crystallinity as compared to thin-films prepared using a flux containing $Bi_2O_3$ only or prepared without using any flux. This is probably because the flux layer containing CuO has a high melting point and CuO serves as a catalyst to control the growth of thin-film. Hence, the thin-film has high crystallinity and high surface flatness on an atomic level. TiO enhances the effect of CuO.

In the method including the step of depositing the CuO flux layer on the wafer and the step of supplying Bi—Ti—O to the flux layer to form the $Bi_4Ti_3O_{12}$ single-crystalline thin-film above the wafer using the $Bi_6Ti_3O_{12}$, $Bi_7Ti_3O_{12}$, or $Bi_8Ti_3O_{12}$ target of which the Bi content is greater than that of an object film, an excessive amount of Bi serves as a flux and then finally converted into a Bi—Cu—O flux. This method is useful in producing a single-crystalline thin-film, made of $SrBi_2Ta_2O_9$ or $SrBi_2Nb_2O_9$, containing no Ti.

Known thin-films prepared without using any flux have defects or dislocations and the length of the c-axis of the unit cell of the known thin-films is different from that of bulk single crystals. However, if a single-crystalline thin-film containing Bi is prepared using a flux containing one of the two- and three-element compositions containing CuO or a flux containing CuO only, the thin-film has neither defects nor dislocations but high crystallinity and is flat over a large area.

If the $Bi_2O_3$—CuO two-element or $Bi_2O_3$—CuO—TiO three-element composition containing the raw materials and the flux is used to prepare a bulk single crystal by a flux process, CuO serves as a catalyst during the growth of the oxide single crystal to control the crystallinity of the oxide single crystal and prevents the vaporization of Bi having a high vapor pressure.

In a method for producing a single crystal using a flux according to the present invention, the composition (proeutectic phase) of a mixture of raw materials used at the start of the growth of the single crystal is critical. For the preparation of a thin-film, the mixture forms a proeutectic phase. For the preparation of a bulk single crystal, a mixture of a flux and the raw materials forms a proeutectic phase.

Advantages

As described above, according to a method for producing a multi-element single crystal containing Bi, a thin film-shaped or bulk single crystal having high crystallinity can be obtained. Since a flux containing a $Bi_2O_3$—CuO two-element or $Bi_2O_3$—CuO—TiO three-element composition or a flux containing CuO only is used in the method, the single crystal obtained has substantially the same crystallinity as that of single crystals prepared using fluxes containing $Bi_2O_3$ only although a reduced amount of Bi harmful to the environment is used in the method.

BEST MODE FOR CARRYING OUT THE INVENTION

Figure 1:
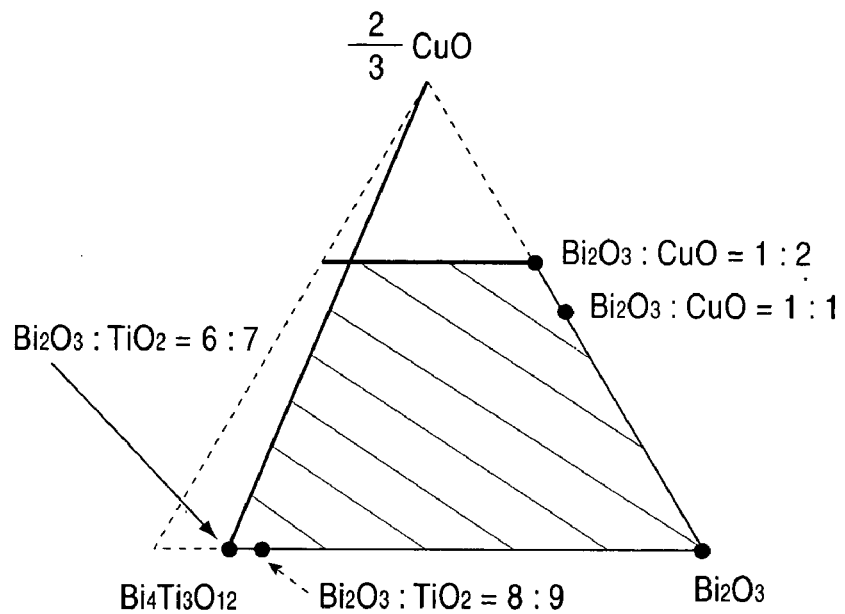
FIG. 1 is a ternary phase diagram of a $Bi_2O_3$—CuO—TiO three-element composition which contains a flux for producing a thin film-shaped single crystal produced by a method according to the present invention or which contains a flux and raw materials for producing a bulk single crystal produced by a method according to the present invention.

FIG. 1 is a ternary phase diagram of a $Bi_2O_3$—CuO—TiO three-element composition which contains a flux for producing a thin film-shaped single crystal produced by a method according to the present invention or which contains a flux and raw materials for producing a bulk single crystal produced by a method according to the present invention. The composition satisfies the inequalities $0<CuO/Bi_2O_3<2$ and $0\leq TiO/Bi_2O_3<7/6$ on a molar basis as shown in FIG. 1. The melting point of $Bi_2O_3$ is 850° C. and that of CuO is 1200° C. An increase in the content of CuO therefore increases the melting point of the composition. When the ratio $CuO/Bi_2O_3$ is less than two, the composition has a melting point of 1000° C. or less and therefore serves as a flux. However, when the ratio $CuO/Bi_2O_3$ is greater than or equal to two, the composition has a higher melting point and therefore hardly serves as a flux because it is difficult to melt the composition. The composition more preferably satisfies the inequality $0<CuO/Bi_2O_3<4/3$ on a molar basis.

A multi-element oxide containing bismuth is a ferroelectric material represented by the formula $(Bi_2O_2)A_{m-1}B_mO_{3m+1}$, wherein A is Sr, Ba, Ca, or Bi and B is Ti, Ta, or Nb. Since such an oxide is an incongruent compound, the oxide can be precipitated only from a phase containing a large amount of Bi. As is clear from a $Bi_2O_3$—$TiO_2$ phase diagram, when the ratio $TiO/Bi_2O_3$ is greater than 7/6, $Bi_2Ti_2O_7$, $Bi_2Ti_4O_{11}$, and $TiO_2$ are precipitated. This is not preferable. Therefore, the composition more preferably satisfies the inequality $0\leq TiO/Bi_2O_3<9/8$ on a molar basis.

Figure 2:
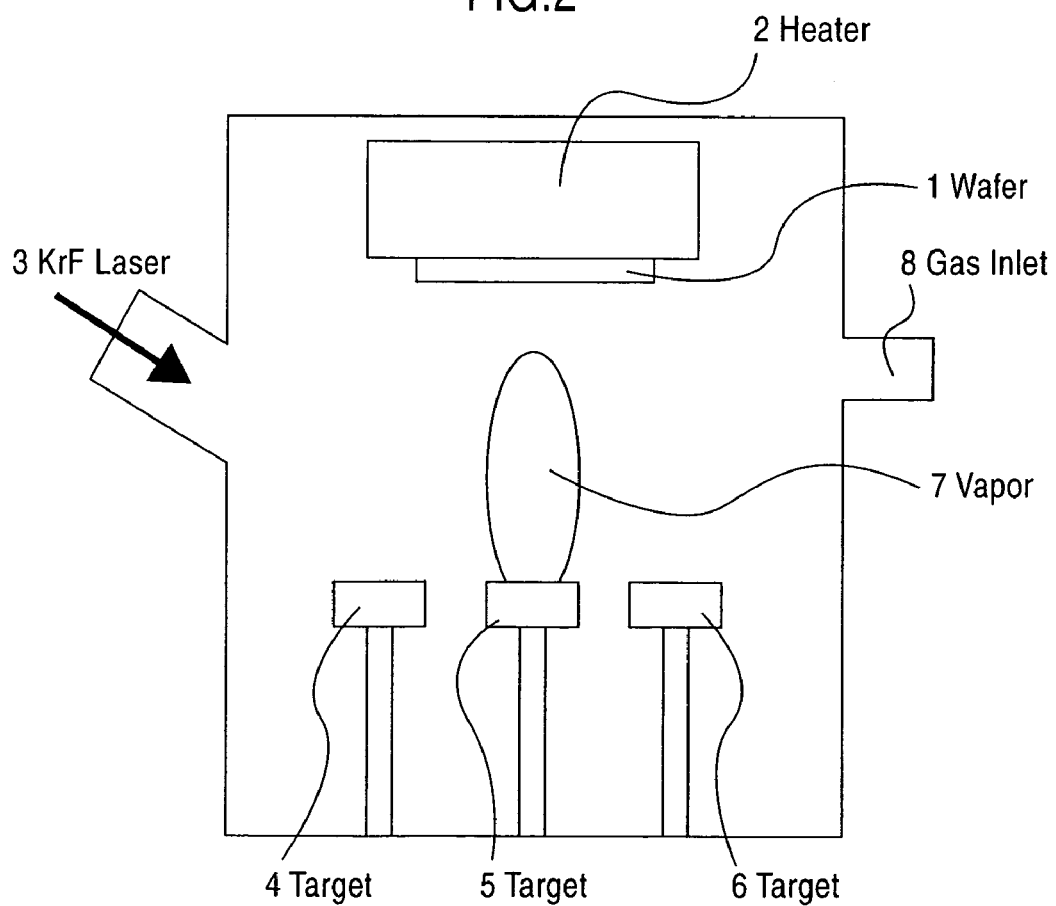
FIG. 2 is a schematic view of a deposition system used in a pulsed laser deposition process used in Example 1 and Comparative Example 1.

Principal steps included in methods of the present invention will now be described. Although a flux layer, a seed layer, and a single-crystalline thin-film can be formed by an ordinary pulse laser deposition (PLD) process, a sputtering process, an MBE process, an MOCVD process, or another process, the use of the PLD process is described below in detail with reference to FIG. 2.

Known deposition systems that can be used in the PLD process have various structures. Such deposition systems can be used in the methods of the present invention. One of the deposition systems includes a chamber that can be evacuated. A single-crystalline wafer 1 is retained in the chamber and heated with a heater 2 located on the rear side of the wafer 1. Targets 4, 5, and 6 are arranged in the chamber and irradiated with a laser beam emitted from a KrF laser 3 placed outside the chamber, whereby the surfaces of the targets are vaporized. Each target used to form a single crystal is a polycrystalline sintered body having the same composition and structure as those of a ferroelectric oxide to be deposited. Vapor 7 of the target reaches the heated wafer 1, whereby the single crystal is deposited on a flux layer placed on the wafer 1.

The chamber has a gas inlet 8 through which oxygen gas is supplied such that the partial pressure of oxygen in the chamber can be adjusted. In the PLD process, a layer in process can be oxidized in such a manner that oxidation gas such as $O_2$ or $O_3$ is introduced into the chamber simultaneously with the start of deposition.

Japanese Unexamined Patent Application Publication Nos. 7-267791 and 5-43390 disclose examples of the system. A deposition system disclosed in the former document includes a chamber and an oxygen inlet. A wafer is placed on an upper portion of the chamber and a target is placed on a lower portion of the chamber such that the target is opposed to the wafer. The oxygen inlet is located close to the wafer. A deposition system disclosed in the latter document includes a chamber in which oxygen gas flows around a wafer in parallel thereto. Examples of the wafer 1 include a $SrTiO_3$ (001) wafer, a Si wafer, an $Al_2O_3$ wafer, a $LaAlO_3$ wafer, a MgO wafer, a $NdGaO_3$ wafer.

The methods of the present invention can be used to produce an oxide single-crystalline material using a flux such as a $Bi_2O_3$ derivative including $Bi_4Ti_3O_{12}$, $Bi_4BaTi_4O_{15}$, $Bi_4SrTi_4O_{15}$, $Bi_4CaTi_4O_{15}$, $SrBi_2Ta_2O_9$, and $SrBi_2Nb_2O_9$. A method for producing a $Bi_4Ti_3O_{12}$ single-crystalline thin-film will now be described in detail.

A procedure for depositing a flux layer containing the following composition on a wafer and then depositing the single-crystalline thin-film on the flux layer placed on the wafer is as described below: a $Bi_2O_3$—CuO—TiO three-element composition satisfying the inequalities $0<CuO/Bi_2O_3<2$ and $0\leq TiO/Bi_2O_3<7$ on a molar basis.

In a first step, one or more targets are selected by remote-controlling a stepping motor from outside. The targets are made of $Bi_4Ti_3O_{12}$, $Bi_2O_3$, or CuO. The targets are individually ablated by varying the energy or pulse number of an ablation laser such that a $Bi_2O_3$—CuO two-element composition satisfying the inequality $0<CuO/Bi_2O_3<2$ or the $Bi_2O_3$—CuO—TiO three-element composition satisfying the inequalities $0<CuO/Bi_2O_3<2$ and $0\leq TiO/Bi_2O_3<7$ can be obtained. If the single target is used, this target needs to have the same composition as described above. A seed layer having the same composition as that of the single-crystalline thin-film may be deposited on the wafer 1 in advance. The first step is preferably performed at a wafer temperature of about 400° C. to 600° C. in an oxygen atmosphere having an oxygen partial pressure of about 10 to 400 Pa.

In a second step, the temperature of the wafer placed in a chamber used in the first step is increased. The second step is preferably performed at such a wafer temperature that the flux layer is not vaporized, that is, a wafer temperature of about 650° C. to 750° C., in an oxygen atmosphere having an oxygen partial pressure of about 10 to 70 Pa.

In a third step, a $Bi_4Ti_3O_{12}$ vapor is generated from the target made of $Bi_4Ti_3O_{12}$ and vapor species of an object oxide are deposited on the flux layer placed on the wafer, whereby the thin-film having high quality is formed. Since the thin-film is formed at a reduced pressure in an atmosphere having an oxygen partial pressure of about 10 to 70 Pa, the flux layer is substantially liquid under these conditions. After the formation of the thin-film, pieces of the flux layer remain on the thin-film in the form of droplets. These pieces can be removed with an etching solution containing 5% HCl.

In a method for producing an oxide single-crystalline thin-film made of $Bi_4Ti_3O_{12}$ in such a manner that a CuO flux layer is deposited on a wafer and a Bi—Ti—O compound represented by the formula $Bi_6Ti_3O_x$ is supplied to the wafer, an excessive amount of Bi serves as a flux and is finally converted into a Bi—Cu—O flux. This method is preferably used to produce a single-crystalline thin-film, made of $SrBi_2Ta_2O_3$ or $Bi_2Sr_2CaCu_2O_8$, containing no Ti.

Steps of this method are as described below.

In a first step, a CuO target is selected and then ablated, whereby a flux layer is formed on a wafer. It is preferable that the partial pressure of oxygen in a chamber be about 800 to 1300 Pa and the temperature of the wafer be about 750° C. to 850° C. A seed layer may be deposited on the wafer in advance. Since an increase in the thickness of the flux layer made of CuO enhances the crystallinity of the single-crystalline thin-film, the flux layer preferably has a thickness of 10 nm or more and more preferably 20 nm or more.

In a second step, $Bi_4Ti_3O_{12}$ is deposited on the wafer using a $Bi_6Ti_3O_{12}$, $Bi_7Ti_3O_{12}$, or $Bi_8Ti_3O_{12}$ target of which the Bi content is greater than that of an object film. The pressure in the chamber may be the same as that used in the first step. Since the thin-film is formed at a reduced pressure in an atmosphere having an oxygen partial pressure of about 800 to 1300 Pa, the flux layer is substantially liquid under these conditions. In this method, pieces of the flux layer that remain on the single-crystalline thin-film can be removed by ultrasonic cleaning or the like using a HCl solution.

In a method of the present invention, the sputtering process can be used for the vapor deposition process. In the sputtering process, high-energy ions produced in plasma are applied to a target and atoms are thereby ejected from the target and then deposited on a wafer, whereby a crystalline thin film is formed. In order to control the composition of the flux layer made of the $Bi_2O_3$—CuO two-element composition or the $Bi_2O_3$—CuO—TiO three-element composition, the following technique may be used: a technique in which a single target made of a composition satisfying the inequalities $0<CuO/Bi_2O_3<2$ and $0\leq TiO/Bi_2O_3<7/6$ is used or a technique in which the sputtering time of a $Ba_4Ti_3O_{12}$ target, a $Bi_2O_3$ target, and a CuO target is varied or the time during which the wafer passes over each target is varied.

In a method of the present invention, a chemical vapor deposition (CVD) process can be used for the vapor deposition process. In the chemical vapor deposition process, organometals having high vapor pressures are prepared and molecules of the organometals are introduced into a chamber for forming a thin-film using gas, for example, argon. The organometal molecules are decomposed on a wafer, whereby organic components are scattered and metal atoms are deposited on the wafer. This results in the formation of the thin-film.

In order to control the flow rate of each organometal, the temperature of a vessel for vaporizing the organometal is varied or a valve placed in a pipe through the organometal passes is controlled. In the deposition system having the above configuration, any elements can be supplied by controlling valves placed in pipes for supplying a plurality of organometals.

In a method of the present invention, the molecular beam epitaxy (MBE) process can be used for the vapor deposition process. In the molecular beam epitaxy process, elements such as bismuth, titanium, and copper are separately supplied from effusion cells for generating atomic fluxes. When an element having a high melting point is used, a cell heated with an electron gun may be used. The flow rate of each atomic flux is controlled by varying the temperature of the cells and/or the output of the electron gun and/or by controlling shutters placed above the cells.

Figure 3:
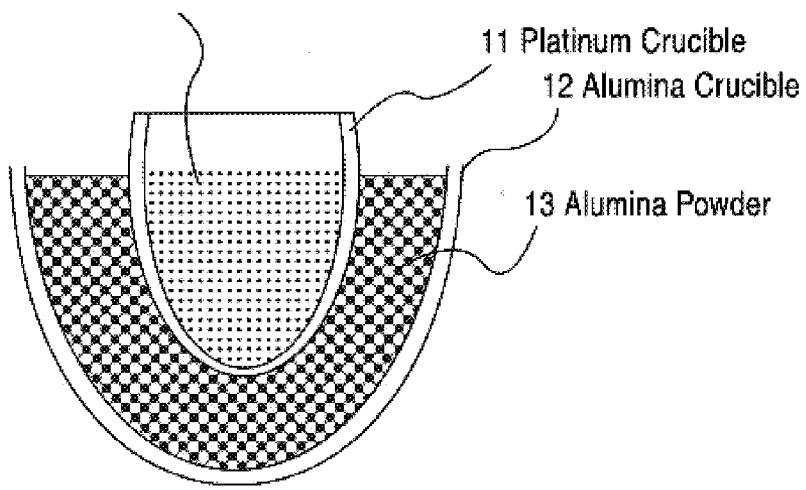
FIG. 3 is a schematic view of a deposition system used in a flux process used in Example 2 and Comparative Example 2.

A method for producing a bulk $Bi_4Ti_3O_{12}$ single crystal will now be described. An apparatus used in a flux process includes a high-temperature electric furnace that can be heated to 1500° C. and a platinum crucible for storing raw materials and a flux. With reference to FIG. 3, the platinum crucible 11 is placed in an alumina crucible 12 such that the platinum crucible 11 is prevented from being distorted. A space between the two crucibles is filled with alumina powder 13. The flux and the raw materials for forming the oxide single crystal are mixed such that the composition of the mixture satisfies the inequalities $0<CuO/Bi_2O_3<2$ and $0\leq TiO/Bi_2O_3<7/6$ on a molar basis. That is, the inequalities $0<CuO/Bi_2O_3<2$ and $0\leq TiO/Bi_2O_3<7/6$ on a molar basis is satisfied at the start of the growth of the crystal on a molar basis.

The raw material-flux mixture 14 is placed into the platinum crucible 11 and then heated to 1250° C. in the electric furnace. It has been reported that $Bi_4Ti_3O_{12}$ is usually melted at 1250° C. and 1 atm. The raw material-flux mixture 14 is maintained at this temperature for 12 hours and then slowly cooled at a rate of 3 to 12° C./hour. The raw material-flux mixture 14 is cooled to, for example, 900° C. over 120 hours, whereby a crystal nucleus is generated and then grown into the crystal. In this operation, a seed crystal may be used. The resulting raw material-flux mixture 14 is cooled from 900° C. to room temperature over six hours. In the flux process, the flux remains in the platinum crucible after the growth of the crystal. The single crystal is separated from the flux by pouring an acid solution such as a nitric acid solution into the platinum crucible and then taken out of the platinum crucible. If the flux is not dissolved in the acid solution, the flux can be dissolved in the acid solution by heating the acid solution, whereby the single crystal can be obtained.

EXAMPLES

Example 1

A $Bi_4Ti_3O_{12}$ ferroelectric thin-film was prepared by an ordinary pulsed laser deposition process. A target used to deposit an oxide thin-film for forming a flux layer was a sintered body ($Bi_2O_3:TiO_2:CuO=27:27:2$) prepared by processing a mixture of a CuO powder and a powder with a Bi to Ti ratio of two to one. A target for forming the $Bi_4Ti_3O_{12}$ ferroelectric thin-film was prepared in such a manner that a $Bi_2O_3$ powder and a $TiO_2$ powder were compounded at a desired ratio and the compound was heated at 700° C. in an ordinary electric furnace.

In a first step, a pulsed laser deposition system and a $SrTiO_3$ (100) wafer were used. Each target was selected with a stepping motor remote-controlled from outside. A $Bi_2TiO_x$ sub-layer with a thickness of 0.9 nm was deposited on the wafer with a pulsed laser and a CuO sub-layer with a thickness of 0.1 nm was deposited on the $Bi_2TiO_x$ sub-layer using a CuO target. This operation was repeated 20 times in total, whereby a flux layer with a thickness of 20 nm was prepared. Since a 1-nm layer portion was formed in one operation, the composition of the flux layer was uniform in the thickness direction on an atomic level. In the first step, the temperature of the wafer was 500° C., the partial pressure of oxygen was 70 Pa, and the output and pulse frequency of a KrF excimer laser used were 1.8 J/cm² and 10 Hz, respectively.

In a second step, the wafer temperature was increased to 700° C. over 10 minutes and then maintained at 700° C. for 10 minutes.

In a third step, the $Bi_4Ti_3O_{12}$ thin-film was deposited on the flux layer under conditions below using the target for forming the $Bi_4Ti_3O_{12}$ thin-film. The thin-film had a thickness of 500 nm. In the third step, the deposition rate was 8 nm/minute, the deposition time was 60 minutes, the wafer temperature was 700° C., the partial pressure of oxygen was 70 Pa, and the output and pulse frequency of the KrF excimer laser were 1.8 J/cm² and 10 Hz, respectively.

Figure 4:
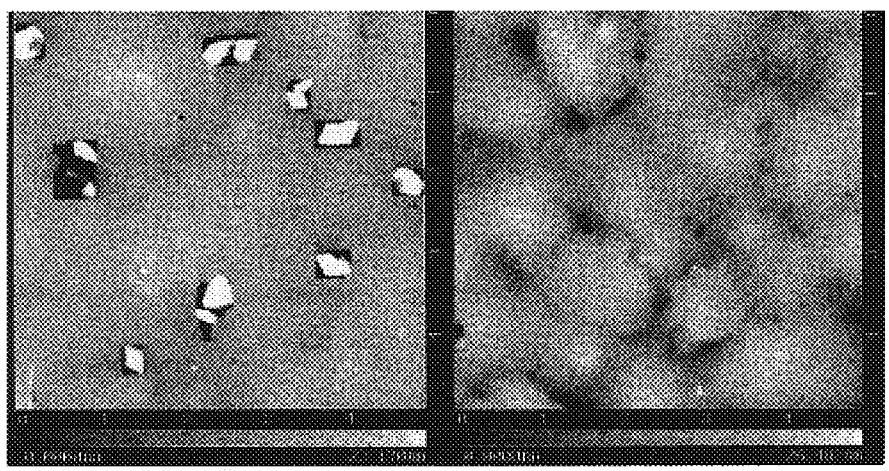
FIG. 4 includes AFM photographs which are alternatives to drawings: the right photograph shows the surface morphology of a single crystal prepared in Example 1 and the left photograph shows the surface morphology of a single crystal prepared in Comparative Example 1.
Figure 5:
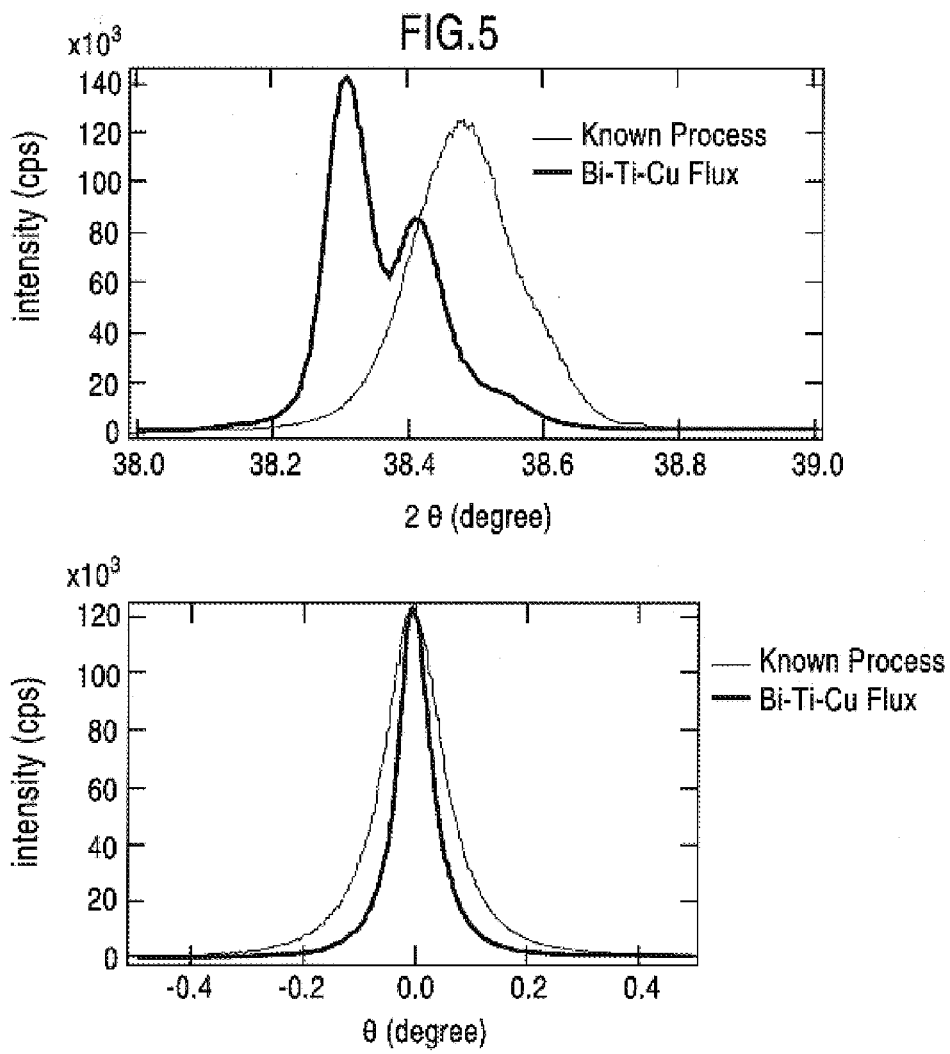
FIG. 5 includes graphs showing XRD patterns of the single crystal of Example 1 and the single crystal of Comparative Example 1 (the upper graph shows 2θ-θ XRD patterns and the lower graph shows rocking curves of (0014) peaks).

The obtained $Bi_4Ti_3O_{12}$ thin-film, which was oriented in the c-axis, was observed for surface morphology with by AFM and evaluated for crystallinity by XRD. As shown in the right half of FIG. 4, the observation by AFM shows that the thin-film has a step/terrace structure having a height substantially equal to half of the length of the c-axis of the unit cell and the surface thereof is flat on an atomic level. As shown in FIG. 5, the evaluation by XRD shows that the (0014) peak of this thin-film has a half-width of 0.076 and that of a thin-film prepared by an ordinary PLD process has a half-width of 0.148, that is, the (0014) peak of this thin-film is very sharp.

Comparative Example 1

A $Bi_4Ti_3O_{12}$ target was used to form a flux layer similar to that of Example 1. The target contained no CuO. The flux layer was 20 nm. A $Bi_4Ti_3O_{12}$ thin-film was prepared under the same conditions as those of Example 1 except the above conditions. As shown in the left half of FIG. 4 and FIG. 5, the thin-film has low crystallinity because the flux layer contains neither Ti nor Cu.

Example 2

A raw material powder and a flux powder were weighed out such that a mixture of the powders had a weight of 80 g and a $Bi_2O_3$ to $TiO_2$ to CuO ratio of 10 to 3 to 1 on a molar basis. The mixture was placed into an agate crucible and then agitated. In this operation, ethanol was added to the mixture such that the powders were uniformly mixed. After ethanol was removed, the resulting powder mixture was placed into a platinum crucible (35 ml size). The platinum crucible was placed into an alumina crucible and a space between the two crucibles was filled with an alumina powder.

The alumina crucible was placed into an electric furnace and then heated to 1250° C. over four hours and maintained at 1250° C. for 12 hours. The alumina crucible was slowly cooled to 900° C. over 120 hours. The resulting alumina crucible was cooled from 900° C. to room temperature over six hours. A single crystal obtained was covered with a flux and could not be taken out of the alumina crucible; hence, the flux was removed with concentrated nitric acid.

Figure 6:
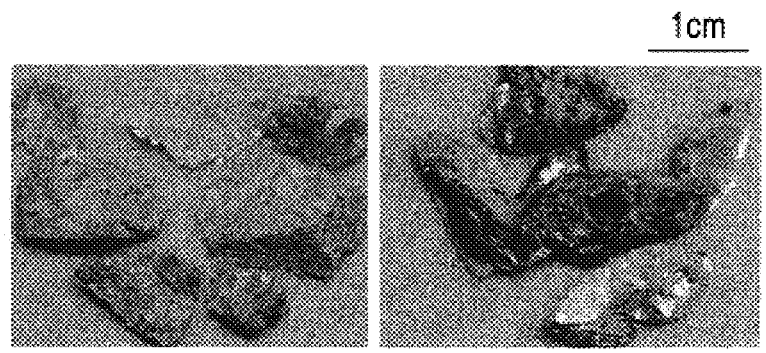
FIG. 6 includes optical photographs which are alternatives to drawings: the right photograph shows the appearance of a single crystal prepared in Example 2 and the left photograph shows the appearance of a single crystal prepared in Comparative Example 2.

The right half of FIG. 6 is an optical photograph, which is an alternative to a drawing, showing the appearance of the bulk single crystal. Although the powder mixture contained 7% by mole of Cu, which was an impurity to $Bi_4Ti_3O_{12}$, and the flux contained a reduced amount of $Bi_2O_3$, the bulk single crystal having substantially the same length (about 1 cm) as that of a bulk single crystal disclosed in Non-patent Document 2 was obtained as shown in the right half of FIG. 6.

Comparative Example 2

A $Bi_2O_3$ powder and a $TiO_2$ powder were weighed out such that a mixture of these powders had a weight of 80 g and a $Bi_2O_3$ to $TiO_2$ ratio of 11 to 3 on a molar basis. This mixture contained no CuO but a greater amount of $Bi_2O_3$ as compared to that of Example 2. This mixture was placed into an agate crucible and then agitated. In this operation, ethanol was added to this mixture such that these powders were uniformly mixed. After ethanol was removed, this resulting mixture was placed into a platinum crucible (35 ml size). The platinum crucible was placed into an alumina crucible and a space between the two crucibles was filled with an alumina powder.

The alumina crucible was placed into an electric furnace and then heated to 1250° C. over four hours and maintained at 1250° C. for 12 hours. The alumina crucible was slowly cooled to 900° C. over 120 hours. The resulting alumina crucible was cooled from 900° C. to room temperature over six hours. A single crystal obtained was covered with a flux and fixed to the alumina crucible. The flux was removed with concentrated nitric acid, whereby the single crystal was obtained.

The left half of FIG. 6 is an optical photograph, which is an alternative to a drawing, showing the appearance of the bulk single crystal. The bulk single crystal having substantially the same length (about 1 cm) as that of the bulk single crystal disclosed in Non-patent Document 2 was obtained as shown in the left half of FIG. 6.

Example 3

A $Bi_4Ti_3O_{12}$ ferroelectric thin-film was prepared by an ordinary pulsed laser deposition process. A target for forming the $Bi_4Ti_3O_{12}$ ferroelectric thin-film was identical to that used in Example 1. A CuO target for forming a CuO flux was a sintered body prepared by processing a CuO powder. A $SrTiO_3$ (100) wafer having a $Bi_2TiO_x$ seed layer, placed thereon, having a thickness of 20 nm was used, the seed layer being deposited on the wafer with a KrF excimer laser under the following conditions: a wafer temperature of 800° C., an oxygen partial pressure of 800 Pa, a laser output of 1.8 J/cm², and a pulse frequency of 10 Hz.

In a first step, a CuO flux layer with a thickness of 20 nm was deposited on the seed layer with the KrF excimer laser using the CuO target under the following conditions: a wafer temperature of 800° C., an oxygen partial pressure of 800 Pa, a laser output of 1.8 J/cm², and a pulse frequency of 10 Hz.

In a second step, the thin-film was deposited on the CuO flux layer with the KrF excimer laser using the target having a composition represented by the formula $Bi_6Ti_3O_x$ under the following conditions: a wafer temperature of 800° C., an oxygen partial pressure of 800 Pa, a laser output of 1.8 J/cm², a pulse frequency of 10 Hz, a deposition rate of 8 nm/minute, and a deposition time of 60 minutes. An amount of BiO that was excessive to the $Bi_4Ti_3O_{12}$ thin-film was converted into a CuO—BiO flux, which was precipitated on the surface of the film, whereby the $Bi_4Ti_3O_{12}$ thin-film was formed. The $Bi_4Ti_3O_{12}$ thin-film had a thickness of 300 nm. The flux remaining on the $Bi_4Ti_3O_{12}$ thin-film was removed by ultrasonically cleaning the $Bi_4Ti_3O_{12}$ thin-film for two seconds using a solution containing 5% by volume of HCl. The obtained $Bi_4Ti_3O_{12}$ thin-film had a large grain size of several microns.

Comparative Example 3

Figure 7:
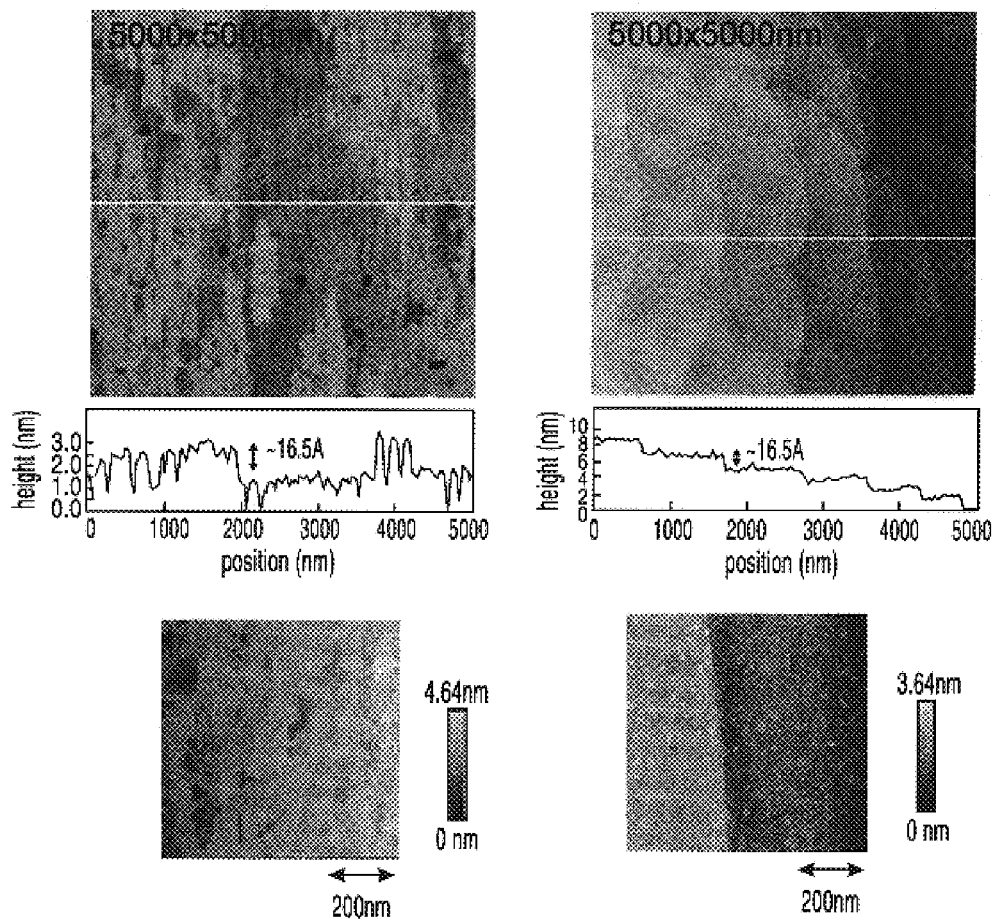
FIG. 7 includes AFM photographs which are alternatives to drawings: the right photograph shows the appearance of a single-crystalline thin-film prepared in Example 3 and the left photograph shows the appearance of a single-crystalline thin-film prepared in Comparative Example 3.
Figure 8:
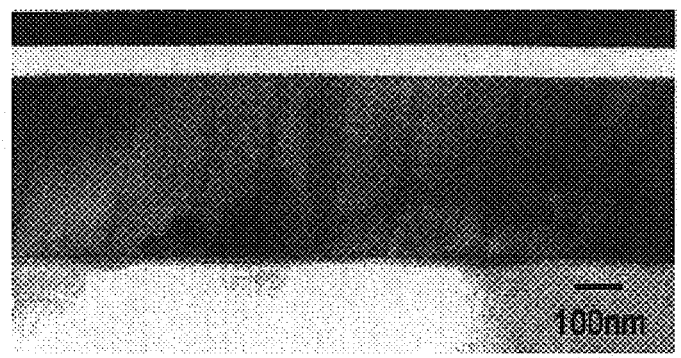
FIG. 8 includes TEM photographs which are alternatives to drawings: the lower photograph shows the appearance of the single-crystalline thin-film of Example 3 and the upper photograph shows the appearance of the single-crystalline thin-film of Comparative Example 3.
Figure 8:
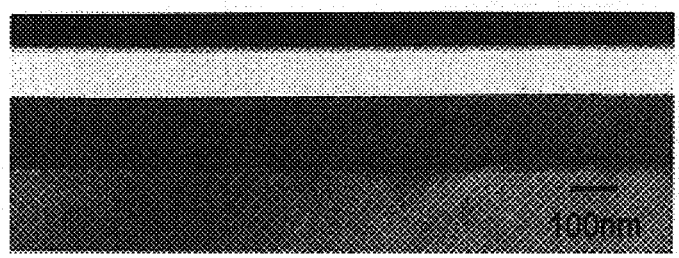

A $Bi_4Ti_3O_{12}$ thin-film was prepared under the same conditions as those described in Example 1 except that no CuO flux was used. The right half of FIG. 7 is an AFM image of the $Bi_4Ti_3O_{12}$ thin-film prepared in Example 3 and the left half thereof is an AFM image of the $Bi_4Ti_3O_{12}$ thin-film prepared in Comparative Example 3. In the left half of FIG. 7 that shows the $Bi_4Ti_3O_{12}$ thin-film prepared using no CuO flux at high magnification, dislocations due to a step wafer are observed. In contrast, in the right half of FIG. 7 that shows the $Bi_4Ti_3O_{12}$ thin-film prepared using the CuO flux, no dislocations are observed, that is, this $Bi_4Ti_3O_{12}$ thin-film is flat over a large area (5 micron square) on an atomic level. The same result as that observed by AFM can be obtained by TEM. In the upper half of FIG. 8 that shows the $Bi_4Ti_3O_{12}$ thin-film prepared in Comparative Example 3, dislocations due to a step wafer are observed. However, in the lower half of FIG. 8 that shows the $Bi_4Ti_3O_{12}$ thin-film prepared in Example 3, no dislocations are observed.

INDUSTRIAL APPLICABILITY

A method of the present invention is useful in producing a defect-free thin-film material or bulk material made of single-crystalline $Bi_4Ti_3O_{12}$. These materials are expected to be applied to wafers for thin-film deposition and/or lead-free non-volatile ferroelectric memories.

The invention claimed is:

1. A method for producing a multi-element oxide single crystal containing bismuth, comprising:
 a step of depositing a flux layer on a wafer, said flux layer containing a three-element composition satisfying the inequalities $0<CuO/Bi_2O_3<2$ and $0<TiO/Bi_2O_3<7/6$ on a molar basis; and
 a step of depositing a single-crystalline thin-film on the flux layer placed on the wafer.

2. A method for producing a multi-element oxide single crystal containing bismuth, comprising:
 a step of depositing a flux layer consisting of CuO on a wafer; and
 a step of supplying Bi—Ti—O to the flux layer to form a $Bi_4Ti_3O_{12}$ single-crystalline thin-film above the wafer using a $Bi_6Ti_3O_{12}$, $Bi_7Ti_3O_{12}$, or $Bi_8Ti_3O_{12}$ target of which the Bi content is greater than that of a object film.

3. The method according to claim 1 or 2, wherein the deposition of the flux layer or the single-crystalline thin-film is performed by a sputtering process, an MBE process, a pulsed laser deposition process, or an MOCVD process.

4. The method according to claim 1 or 2, wherein the wafer is a $SrTiO_3$ (001) wafer, an $Al_2O_3$ wafer, a Si wafer, a $LaAlO_3$ wafer, a MgO wafer, or a $NdGaO_3$ wafer.

5. A method for producing a multi-element oxide single crystal, comprising:
 a step of depositing a flux layer on a wafer, said flux layer containing a three-element composition satisfying the inequalities $0<CuO/Bi_2O_3<2$ and $0<TiO/Bi_2O_3<7/6$ on a molar basis, and
 a step of depositing a single-crystalline thin-film on the flux layer placed on the wafer, wherein the single-crystalline thin-film comprises a multi-element oxide selected from the group consisting of $Bi_4Ti_3O_{12}$, $Bi_4BaTi_4O_{15}$, $Bi_4SrTi_4O_{15}$, $Bi_4CaTi_4O_{15}$, $SrBi_2Ta_2O_9$, and $SrBi_2Nb_2O_9$.

* * * * *